(12) United States Patent
Liao et al.

(10) Patent No.: US 8,154,029 B2
(45) Date of Patent: Apr. 10, 2012

(54) PLANAR LIGHT SOURCE DEVICE

(75) Inventors: Tsung-Jen Liao, Taipei Hsien (TW);
Yen-Cheng Chen, Taipei Hsien (TW);
Ching-Lin Tseng, Taipei Hsien (TW);
Ming-Li Chang, Taipei Hsien (TW);
Cheng-Tai Chou, Taipei Hsien (TW)

(73) Assignee: Bright LED Electronics Corp., Taipei Hsien (TW)

( * ) Notice: Subject to any disclaimer, the term of this patent is extended or adjusted under 35 U.S.C. 154(b) by 0 days.

(21) Appl. No.: 12/409,667

(22) Filed: Mar. 24, 2009

(65) Prior Publication Data
US 2009/0242908 A1    Oct. 1, 2009

(30) Foreign Application Priority Data
Mar. 25, 2008 (TW) .............................. 97110553 A

(51) Int. Cl.
*H01L 33/00* (2010.01)
(52) U.S. Cl. ...................... 257/79; 257/88; 257/E33.068
(58) Field of Classification Search ...................... 257/79
See application file for complete search history.

(56) References Cited

U.S. PATENT DOCUMENTS

| | | | |
|---|---|---|---|
| 2007/0236934 A1* | 10/2007 | Chang et al. | 362/294 |
| 2007/0298543 A1* | 12/2007 | Su et al. | 438/122 |
| 2008/0225549 A1* | 9/2008 | Dassanayake et al. | 362/554 |

FOREIGN PATENT DOCUMENTS

| | | |
|---|---|---|
| CN | 20031043490 A | 5/2004 |
| CN | 20061073894 A | 10/2007 |
| CN | 20062175518 U | 2/2008 |
| TW | 289947 | 11/2007 |

\* cited by examiner

*Primary Examiner* — Jarrett Stark
*Assistant Examiner* — Lawrence Tynes, Jr.
(74) *Attorney, Agent, or Firm* — Fox Rothschild, LLP; Robert J. Sacco

(57) ABSTRACT

A planar light source device includes: a substrate having a thickness larger than 0.9 mm and including a metal layer; and a plurality of light-emitting diode chips disposed on the substrate in a matrix array. Each light-emitting diode chip has a chip size ranging from 0.0784 mm² to 0.25 mm². Two adjacent ones of the light-emitting diode chips are spaced apart from each other by a distance of at least two times a length of the light-emitting diode chips.

10 Claims, 4 Drawing Sheets

PLANAR LIGHT SOURCE DEVICE

CROSS-REFERENCE TO RELATED APPLICATION

This application claims priority of Taiwanese application no. 097110553, filed on Mar. 25, 2008.

BACKGROUND OF THE INVENTION

1. Field of the Invention

This invention relates to a planar light source device, more particularly to a planar light source device including a plurality of light-emitting diode chips disposed in a matrix array.

2. Description of the Related Art

Referring to FIG. 1, Taiwanese Patent Publication no. 289947 discloses a planar light source device including a substrate 92 and a plurality of light-emitting diode chips 91 disposed in a matrix array on the substrate 92. Each of the light-emitting diode chips 91 has a size smaller than 40 mil (1 mm) (in particular, from 8 mil (0.2 mm) to 14 mil (0.35 mm)). The light-emitting diode chips 91 are connected directly to a circuitry formed on a metal layer of the substrate 92 to enhance heat conduction and light emission efficiency.

However, in practice, the distance between two adjacent ones of the light-emitting diode chips 91 and the thickness of the substrate 92 tend to affect heat dissipation and light-emitting efficiency of the planar light source device. This problem is not addressed in the Taiwanese patent publication.

SUMMARY OF THE INVENTION

Therefore, an object of the present invention is to provide an improvement in a planar light source device in which light-emitting diode chips can maintain a relatively low temperature when the planar light source device operates, thereby alleviating difficulties in dissipating heat from the planar light source device.

According to the present invention, a planar light source device comprises a substrate having a thickness of 1.0 mm or above and including a metal layer; and a plurality of light-emitting diode chips disposed on the substrate in a matrix array. Each of the light-emitting diode chips has a chip size defined by length×width of the chip and ranging from 0.0784 $mm^2$ to 0.25 $mm^2$. Two adjacent ones of the light-emitting diode chips are spaced apart from each other by a distance of at least two times a length of the light-emitting diode chips.

BRIEF DESCRIPTION OF THE DRAWINGS

Other features and advantages of the present invention will become apparent in the following detailed description of the preferred embodiment of this invention, with reference to the accompanying drawings, in which.

DETAILED DESCRIPTION OF THE PREFERRED EMBODIMENT

Figure 1:
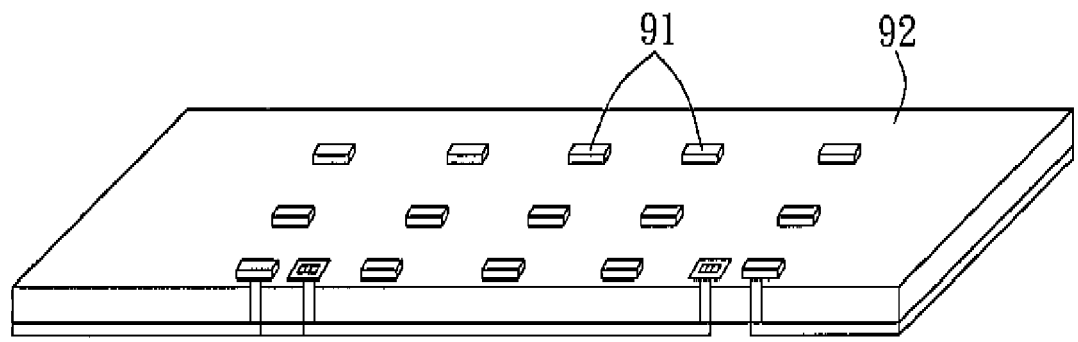
FIG. 1 is a perspective view of a conventional planar light source device.
Figure 2:
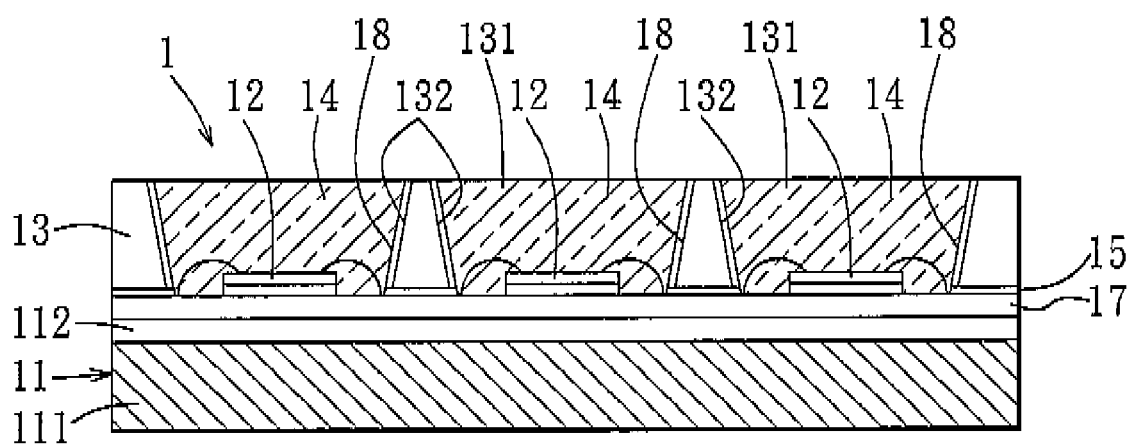
FIG. 2 is a sectional view of the preferred embodiment of a planar light source device according to this invention.

Referring to FIG. 2, there is shown a planar light source device 1 according to a preferred embodiment of this invention.

The planar light source device 1 includes a substrate 11, a plurality of light-emitting diode chips 12 disposed on the substrate 11 in a matrix array, a reflective cover layer 13 disposed on the substrate 11, an adhesive layer 15 formed between the substrate 11 and the reflective cover layer 13 so as to bond together the substrate 11 and the reflective cover layer 13, and a plurality of transparent bodies 14. By means of a conventional method of making white light-emitting diodes, the transparent bodies 14 can contain fluorescent powders to produce a white light. The planar light source device 1 can be used for illumination and can be combined with a heat-dissipating structure for heat dissipation purposes.

In this embodiments the substrate 11 includes a metal layer 111 and an insulation layer 112. The reflective cover layer 13 is formed with a plurality of inner holes 131 and has a plurality of reflective walls 132 respectively defining the inner holes 131. When the reflective cover layer 13 is disposed on the substrate 11, the inner holes 131 are respectively registered with the light-emitting diode chips 12. The transparent bodies 14 are formed within the inner holes 131 of the reflective cover layer 13 so as to enclose the respective light-emitting diode chips 12 within the inner holes 131 of the reflective cover layer 13.

In addition, in this embodiment, the planar light source device 1 further includes a circuit layer 17 disposed between the insulation layer 112 and the reflective cover layer 13, and a reflective coating 18 formed on the reflective walls 132 of the reflective cover layer 13. The light-emitting diode chips 12 are connected to the circuit layer 17 by metal wire bonding or flip chip packaging techniques. The light-emitting diode chips 12 are electrically connected in series or in parallel through the circuit layer 17 according to the circuit design and requirement. In this embodiment, the reflective coating 18 is made of metal and is formed on the reflective walls 132 of the reflective cover layer 13 by electroplating, evaporating, or sputtering.

In another preferred embodiment, the reflective coating 18 can be made of a thermosetting resin, a high temperature resistant resin, or a ceramic material having a high reflectivity. Alternatively, the reflective cover layer 13 can be made of a plastic material with a high reflectivity or a metal material so as to form reflective surfaces directly on the reflective walls 132 of the reflective cover layer 13. In this embodiment, the reflective cover layer 13 is made of aluminum.

Simulations of thermal convention and temperature distribution were performed for the planar light source 1 through three sets of experiments.

Selection of Substrate Area

The substrate 11 was made using a 0.5 mm thick aluminum sheet as the metal layer 111 and a 0.1 mm thick insulation material as the insulation layer 112. Four substrate samples were obtained from the substrate 11. The areas of the substrate samples were 100 $mm^2$, 400 $mm^2$, 625 $mm^2$, and 900 $mm^2$, respectively. Each of the substrate samples had light-emitting diode chips 12 with a size of 1 mm×1 mm. A simulation test was performed for each sample, and the temperature of the chips 12 was measured for each sample. The results are shown in Table 1.

TABLE 1

| | Substrate Area (mm$^2$) | | | |
|---|---|---|---|---|
| | 100 | 400 | 625 | 900 |
| Chip temperature (° C.) | 117 | 104 | 99 | 98 |

Figure 3:
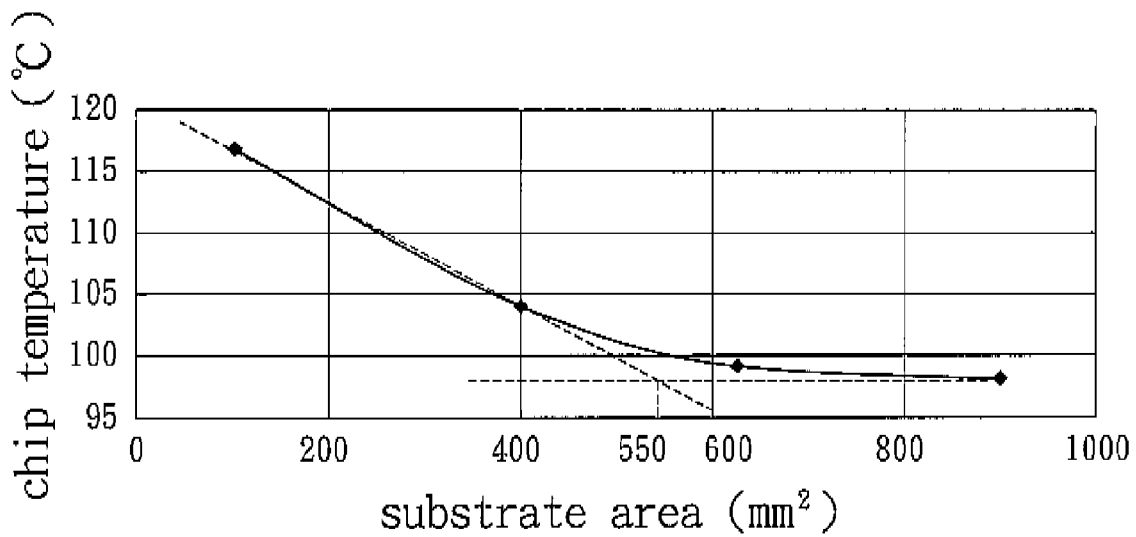
FIG. 3 is a plot of substrate area versus chip temperature.

FIG. 3 is a plot of substrate area versus chip temperature derived from the data of Table 1. The data shows that the chip temperature does not decrease further when the substrate area is larger than 550 mm$^2$ (under this condition the chip temperature is about 101° C.). Therefore, the substrate area of 550 mm$^2$ was chosen for the following experiments.

First Experiments

First experiments were carried out using four groups of samples and using the same input power. The substrate area was 550 mm$^2$ and was the same for all experiments. However, the size of the chips 12, which is defined as length×width, was varied in the experiments.

First group: The chip size is 1 mm×1 mm. The distance between two adjacent chips is 1 mm.

Second group: The chip size is 0.7 mm×0.7 mm. The distance between two adjacent chips is 0.7 mm.

Third group: The chip size is 0.5 mm×0.5 mm. The distance between two adjacent chips is 0.5 mm.

Fourth group: The chip size is 0.34 mm×0.34 mm. The distance between two adjacent chips is 0.34 mm.

Table 2 shows the results of the first to fourth groups of samples.

TABLE 2

| Chip size (mm × mm) | Chip Distance (mm) | Chip temperature (° C.) |
|---|---|---|
| 1 × 1 | 1 | 103 |
| 0.7 × 0.7 | 0.7 | 101.5 |
| 0.5 × 0.5 | 0.5 | 101 |
| 0.34 × 0.34 | 0.34 | 99 |

Figure 4:
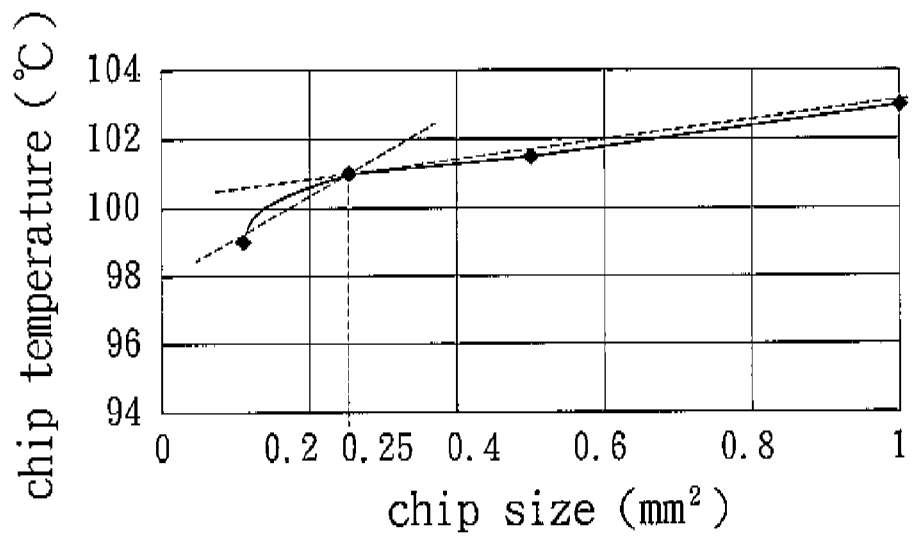
FIG. 4 is a plot of chip size versus chip temperature.

FIG. 4 is a plot of chip size versus chip temperature derived from the data of Table 2. The plot reveals that the smaller the chip size, the lower the chip temperature. However, when the chip size is too small, assembly of the chips 12 on the substrate 11 will be difficult. On the other hand, when the chip size is smaller than 0.0784 mm$^2$ (0.28 mm×0.28 mm), the length or width of the chip is lower than 0.3 mm. Because an InGaN chip usually has a pair of round bonding pads for wire bonding formed thereon, and because each round bonding pad has a diameter of about 0.1 mm, when the two round bonding pads are formed on a chip, the total length of the round bonding pads will exceed half of the length or width of the chip 12 if the length of the chip is lower than 0.3 mm. In such case, the light emitted from the chip 12 will be seriously blocked by the round bonding pads. In consideration of maintaining acceptable chip temperature and reducing the blocking effect of the solder pads, the chip size should be limited to be no less than 0.0784 mm$^2$.

Table 2 and FIG. 4 further show that the larger the chip size, the higher the chip temperature. When the chip size is larger than 0.25 mm$^2$ (400 mil$^2$), the chip temperature increases significantly. Therefore, the chip size should not be larger than 0.25 mm$^2$.

Second Experiments

Based on the results of the first experiments, the chips having the sizes of 0.0784 mm$^2$ (0.28 mm×0.28 mm) and 0.25 mm$^2$ (0.5 mm×0.5 mm) were selected for the second experiments. The distance between the chips was varied in the second experiments, but the substrate area was the same (550 mm$^2$).

Table 3 shows the results for the chips with the size of 0.784 mm$^2$ (0.28 mm×0.28 mm),

TABLE 3

| Chip size (mm × mm) | Chip Distance (mm) | Chip temperature (° C.) |
|---|---|---|
| 0.28 × 0.28 | 0 | 103 |
| 0.28 × 0.28 | 0.2 | 98 |
| 0.28 × 0.28 | 0.4 | 96 |
| 0.28 × 0.28 | 1 | 93.5 |
| 0.28 × 0.28 | 1.5 | 93 |

Figure 5:
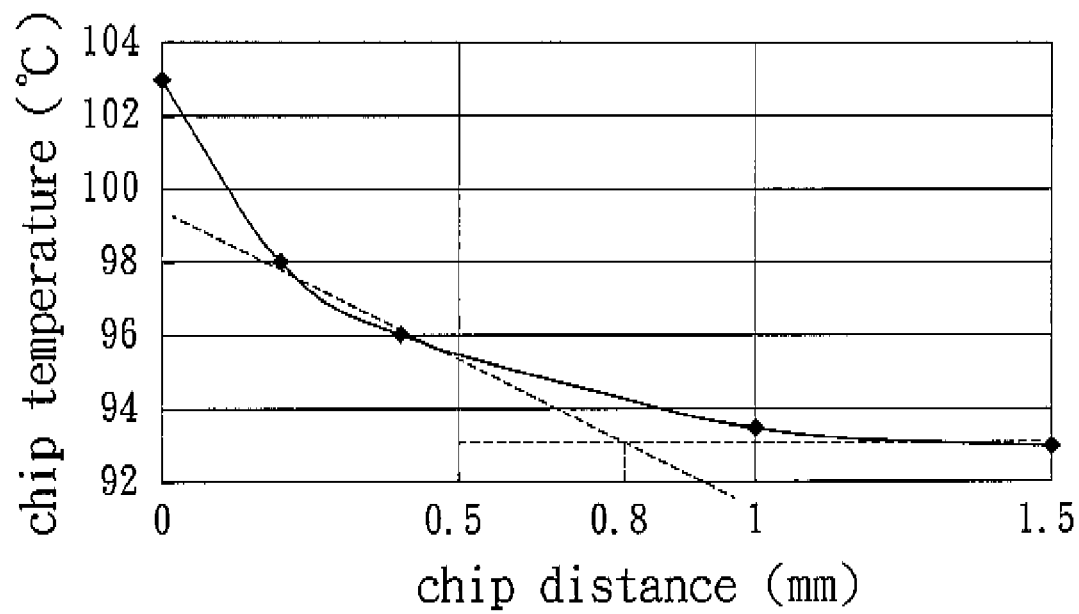
FIG. 5 is a plot of chip distance versus chip temperature for a chip size of 0.28 mm×0.28 mm.

FIG. 5 is a plot of chip distance versus chip temperature derived from the data of Table 3. The plot shows that the chip temperature is reduced as the chip distance is increased and that, when the chip distance is larger than 0.8 mm, the reduction of the chip temperature attenuates. However, the larger the chip distance, the larger the required substrate area. Therefore, the cost of material for manufacture will increase when the chip distance increases. In view of cost considerations, for the chip size of 0.784 mm$^2$ (0.25 mm×0.29 mm) the distance between two adjacent chips should be about 0.5 mm, i.e., about 2.86 (0.8/0.28) times the chip length (0.25 mm).

Likewise, Table 4 shows the results of the experiments for the chip size of 0.5 mm×0.5 mm (0.25 mm$^2$

TABLE 4

| Chip size (mm$^2$) | Chip Distance (mm) | Chip temperature (° C.) |
|---|---|---|
| 0.5 × 0.5 | 0.1 | 103.5 |
| 0.5 × 0.5 | 0.2 | 102.3 |
| 0.5 × 0.5 | 0.5 | 101 |
| 0.5 × 0.5 | 1 | 99.5 |
| 0.5 × 0.5 | 1.5 | 98.6 |
| 0.5 × 0.5 | 2 | 97.7 |
| 0.5 × 0.5 | 2.5 | 97.4 |
| 0.5 × 0.5 | 3 | 97.3 |

Figure 6:
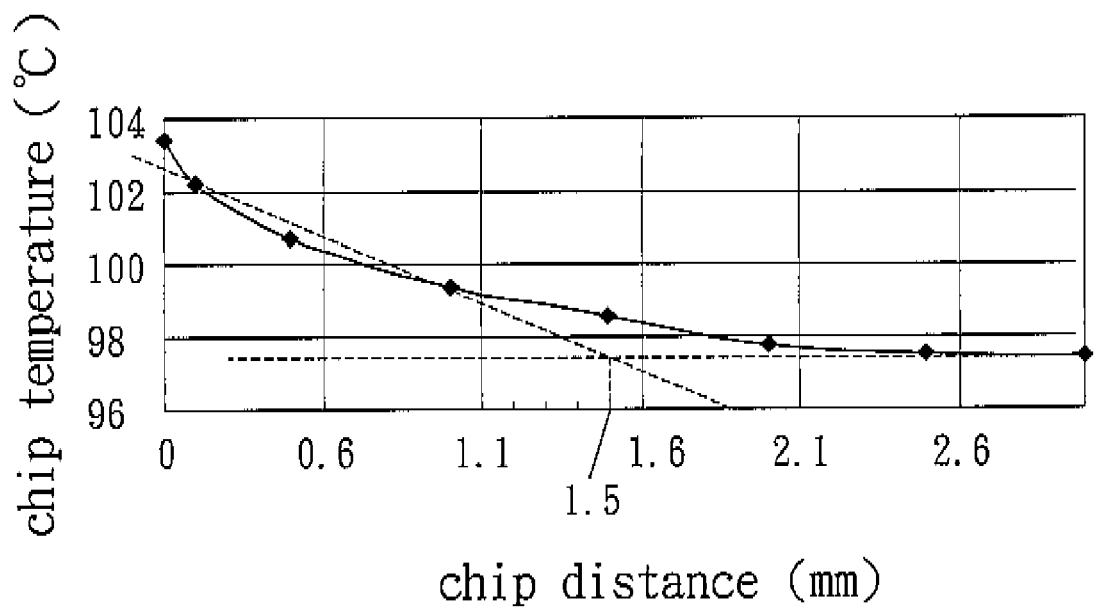
FIG. 6 is a plot of chip distance versus chip temperature for a chip size of 0.5 mm×0.5 mm.

FIG. 6 is a plot of chip distance versus chip temperature which is derived from the data of Table 4. The plot shows that when the chip distance is larger than 1.5 mm, the reduction of the chip temperature attenuates. However, when the chip distance is increased further, the substrate area and the manufacturing cost will increase significantly. In view of cost considerations, for the chip size of 0.5 mm×0.5 mm (0.25 mm$^2$), the chip distance should be about 1.5 mm, i.e., about 3 (1.5/0.5) times the chip length (0.5 mm).

From the results of Tables 3 and 4, to keep the chip temperature at a minimum, the chip distance should be at least two times the length/width of the chip.

Third Experiments

Third experiments were carried out using different substrate thicknesses. The chip size used in the third experiments was 0.0784 mm$^2$ (0.25 mm×0.28 mm). Table 5 shows the results of the experiments.

TABLE 5

| | Substrate thickness (mm) | | | | |
|---|---|---|---|---|---|
| | 0.5 | 0.72 | 1.5 | 2 | 3 |
| Chip temperature (° C.) | 89 | 83 | 80.5 | 80 | 80 |

Figure 7:
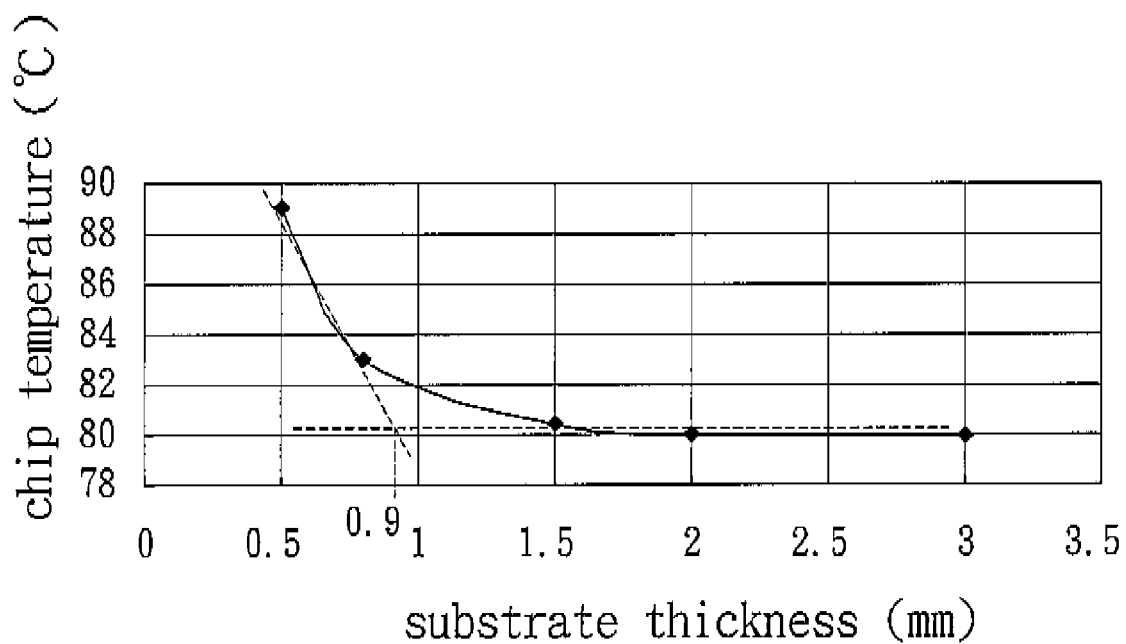
FIG. 7 is a plot of substrate thickness versus chip temperature.

FIG. 7 is a plot of substrate thickness versus chip temperature, which is derived from the data of Table 5. The plot shows that, when the substrate thickness exceeds 0.9 mm, the reduction in chip temperature tends to attenuate. Therefore, the substrate thickness should be preferably 1.0 mm or above so as to maintain a low chip temperature.

In view of the aforesaid experiments, the chip size ranges from 0.0784 mm² to 0.25 mm², when the distance between two adjacent chips is at least two times the length of the chip, and the substrate thickness is 1.0 mm or above, the chip temperature can be maintained at a relatively low level.

It is worth mentioning that the substrates used in the experiments were made of aluminum. Since the material of the substrate has less effect on heat-dissipation as compared to the chip size and the distance between two adjacent chips, the substrate can be made of copper or other metals having a high heat-dissipating property. In addition, each of the light-emitting diode chips 12 may be connected to a Zener diode in parallel for static electricity protection.

The present invention utilizes small-sized light-emitting diode chips 12 which have a relatively high external quantum efficiency and which are not prone to heat accumulation. In particular, the size of the light-emitting diode chips 12 is limited to range from 0.0784 mm² to 0.25 mm². In addition, the light-emitting diode chips 12 are spaced apart from each other by a distance of at least two times the length or width of the light-emitting diode chip 12, and the substrate thickness is limited to be 1.0 mm or above. Therefore, the planar light source device 1 of this invention not only possesses high illumination efficiency but also can operate without significantly increasing the temperature of the light-emitting diode chips 12.

With the invention thus explained, it is apparent that various modifications and variations can be made without departing from the spirit of the present invention. It is therefore intended that the invention be limited only as recited in the appended claims.

What is claimed is:

1. A planar light source device comprising:
   a substrate having a thickness of at least 1.0 mm and including a metal layer; and
   a plurality of light-emitting diode chips disposed on said substrate in a matrix array, each of said light-emitting diode chips having a chip size ranging from 0.0784 mm² to 0.25 mm², two adjacent ones of said light-emitting diode chips being spaced apart from each other by a distance of at least two times a length of said light-emitting diode chips.

2. The planar light source device of claim 1, wherein the distance between two adjacent ones of said light-emitting diode chips is at least 2.86 times the length of said light-emitting diode chips when said chip size is 0.0784 mm².

3. The planar light source device of claim 1, wherein the distance between two adjacent ones of said light-emitting diode chips is at least 3 times the length of said light-emitting diode chips when said chip size is 0.25 mm².

4. The planar light source device of claim 1, wherein the distance between two adjacent ones of said light-emitting diode chips is at least 0.8 mm when said chip size is 0.28 mm×0.28 mm.

5. The planar light source device of claim 1, wherein said metal layer is made of aluminum.

6. The planar light source device of claim 1, wherein said metal layer is made of copper.

7. The planar light source device of claim 1, further comprising a reflective cover layer that is disposed on said substrate and that is formed with a plurality of inner holes, and a plurality of transparent bodies that are respectively filled in said inner holes of said reflective cover layer, said light-emitting diode chips being respectively received in said inner holes of said reflective cover layer and enclosed by said transparent bodies.

8. The planar light source device of claim 7, wherein said reflective cover layer has a plurality of reflective walls respectively defining said inner holes, each of said reflective walls including a reflective coating formed thereon.

9. The planar light source device of claim 7, wherein said reflective cover layer is made of aluminum.

10. The planar light source device of claim 7, further comprising an adhesive layer formed between said substrate and said reflective cover layer.

* * * * *